United States Patent [19]
Cook et al.

[11] Patent Number: 6,022,791
[45] Date of Patent: Feb. 8, 2000

[54] CHIP CRACK STOP

[75] Inventors: Robert Francis Cook, Putnam Valley, N.Y.; Eric Gerhard Liniger, Danbury, Conn.; Ronald Lee Mendelson, Richmond; Richard Charles Whiteside, Charlotte, both of Vt.

[73] Assignee: International Business Machines Corporation, Armonk, N.Y.

[21] Appl. No.: 08/950,691

[22] Filed: Oct. 15, 1997

[51] Int. Cl.[7] .............................. H01L 21/30; H01L 21/46
[52] U.S. Cl. ..................... 438/458; 438/460; 438/462; 438/928
[58] Field of Search .................................. 438/458, 460, 438/462, 928; 257/508, 620

[56] References Cited

U.S. PATENT DOCUMENTS

| | | | |
|---|---|---|---|
| 4,455,739 | 6/1984 | Hynecek | 29/571 |
| 5,096,855 | 3/1992 | Vokoun, III | 437/227 |
| 5,217,916 | 6/1993 | Anderson et al. | 437/51 |
| 5,266,528 | 11/1993 | Yamada | 437/226 |
| 5,414,297 | 5/1995 | Morita et al. | 257/620 |
| 5,477,062 | 12/1995 | Natsume | 257/48 |
| 5,521,125 | 5/1996 | Ormond et al. | 437/227 |
| 5,530,280 | 6/1996 | White | 257/508 |
| 5,552,345 | 9/1996 | Schrantz et al. | 437/227 |
| 5,834,829 | 9/1996 | Dinkel et al. | 257/620 |

*Primary Examiner*—John F. Niebling
*Assistant Examiner*—David A. Zarneke
*Attorney, Agent, or Firm*—James M. Leas

[57] ABSTRACT

A serpentine pattern has been found to be effective at interrupting propagation of delamination cracks in thin film layers. The ring is provided on a semiconductor chip to suppress crack propagation from the chip edge. The ring is effective even though it is filled with metal, the serpentine pattern providing significantly increased area as compared with a standard linear crack stop that the energy for crack propagation is dissipated. In addition to serpentines, pattern features such as staggered filled ring patterns and connected rings will also be effective at reducing the propagation of delamination cracks from edge to active area by virtue of the increased area of interaction between the crack and the crack stop.

15 Claims, 11 Drawing Sheets

CHIP CRACK STOP

FIELD OF THE INVENTION

This invention generally relates to structures for preventing cracks from propagating. More particularly, it relates to crack stop structures positioned along the edges of semiconductor chips. Even more particularly, it relates to structures positioned along the edges of semiconductor chips to prevent delamination cracks from propagating through thin film layers into the chip active area.

BACKGROUND OF THE INVENTION

Figure 1A:
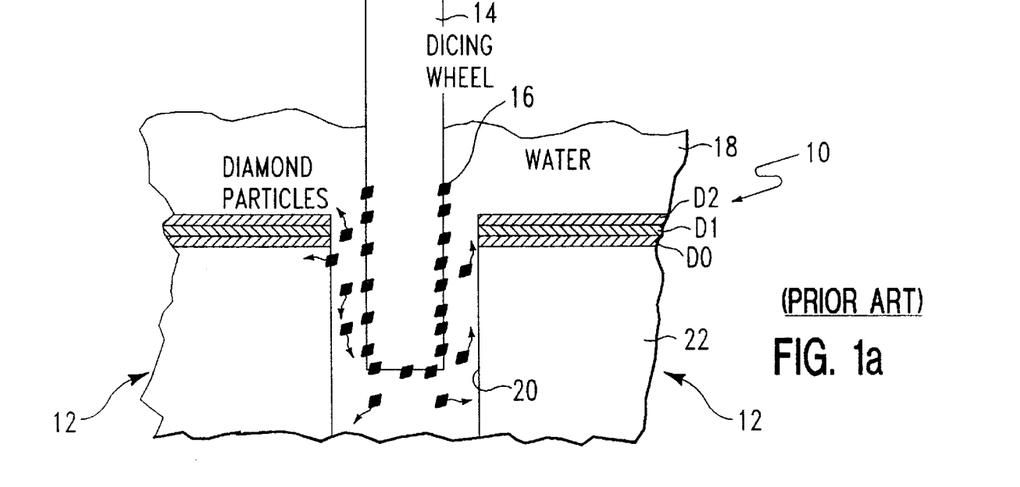
FIG. 1a is a cross sectional view of a saw blade dicing a semiconductor wafer into chips showing the impact of particles on the chips that could lead to cracking of the semiconductor or delamination cracking of thin film layers on the semiconductor
Figure 1B:
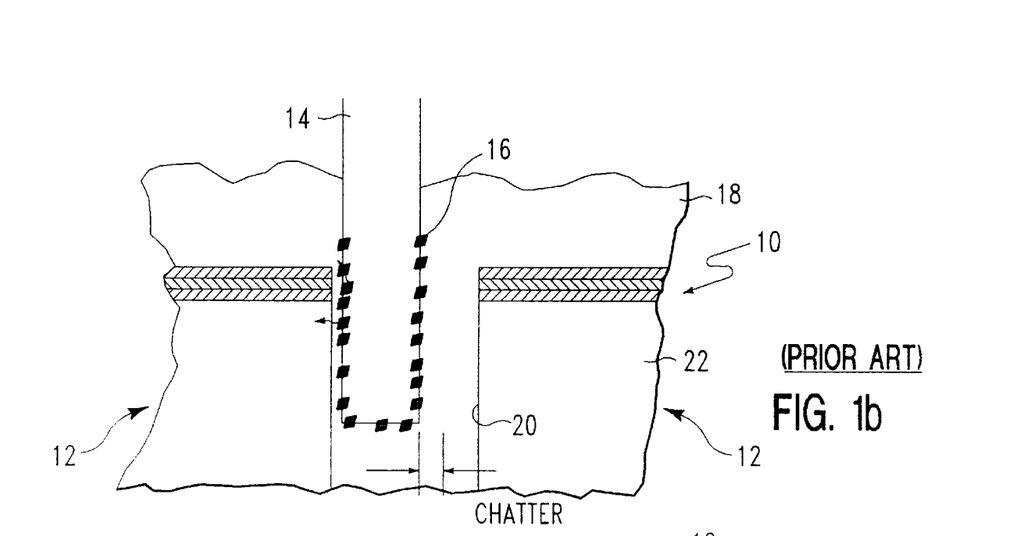
FIG. 1b is a cross sectional view of a saw blade dicing a semiconductor wafer into chips showing the saw blade chatter that could lead to cracking of the semiconductor or delamination cracking of thin film layers on the semiconductor.

Dicing semiconductor wafers is known to introduce cracks that can propagate across chips and lead to chip failure. As shown in FIGS. 1a and 1b, semiconductor wafer 10 is diced into individual chips 12 with high speed circular metallic or resin saw blade 14 having embedded diamond particles 16 while wafer 10 is rinsed with water 18. The impact of high speed particles of diamond or silicon and the lateral motion of saw blade 14 within the dicing channel—known as saw blade chatter and shown in FIG. 1b—frequently damage chip edges 20. The damage may be a crack initiated in semiconductor substrate 22. It may also be a delamination at the interface between the semiconductor substrate 22 and an overlying insulator or between any of the overlying metal layers and insulating layers.

Figure 2:
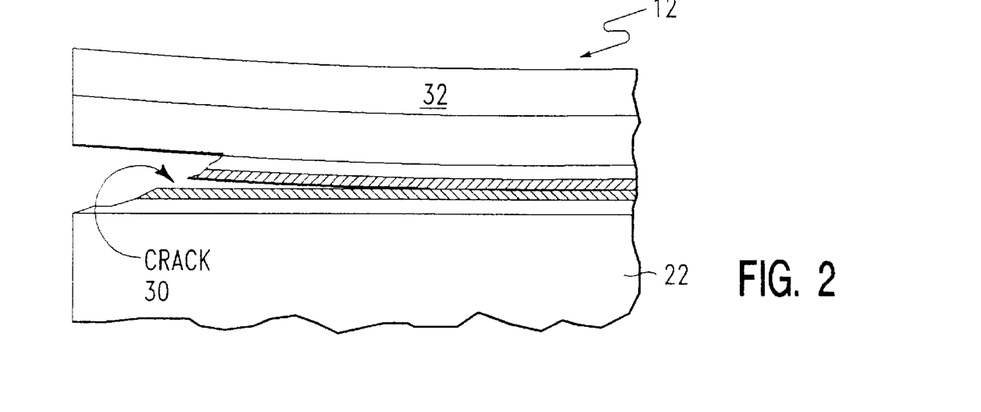
FIG. 2 is a cross sectional view of chip after dicing showing a delamination crack that is propagating from the chip edge toward the active area of the chip.

Once delamination crack 30 in overlying film 32 is initiated, it can propagate inward from edge 20 across the surface of chip 12 to active regions of the chip, as shown in FIG. 2. Particle and blade impacts during dicing can combine with thermal or deposition stresses inherent in thin film layers on a semiconductor to drive delamination cracks into the active device area of the chip. In addition, metals and other thin film layer materials, such as oxide and nitride insulators, can react with aqueous dicing fluid 18 or atmospheric moisture to provide a stress-corrosion mechanism for delamination advance. Thus, delamination cracks tend to propagate across the chip, and these cracks can cause electrical opens or shorts and, ultimately cause failure of the semiconductor chip.

Figure 3A:
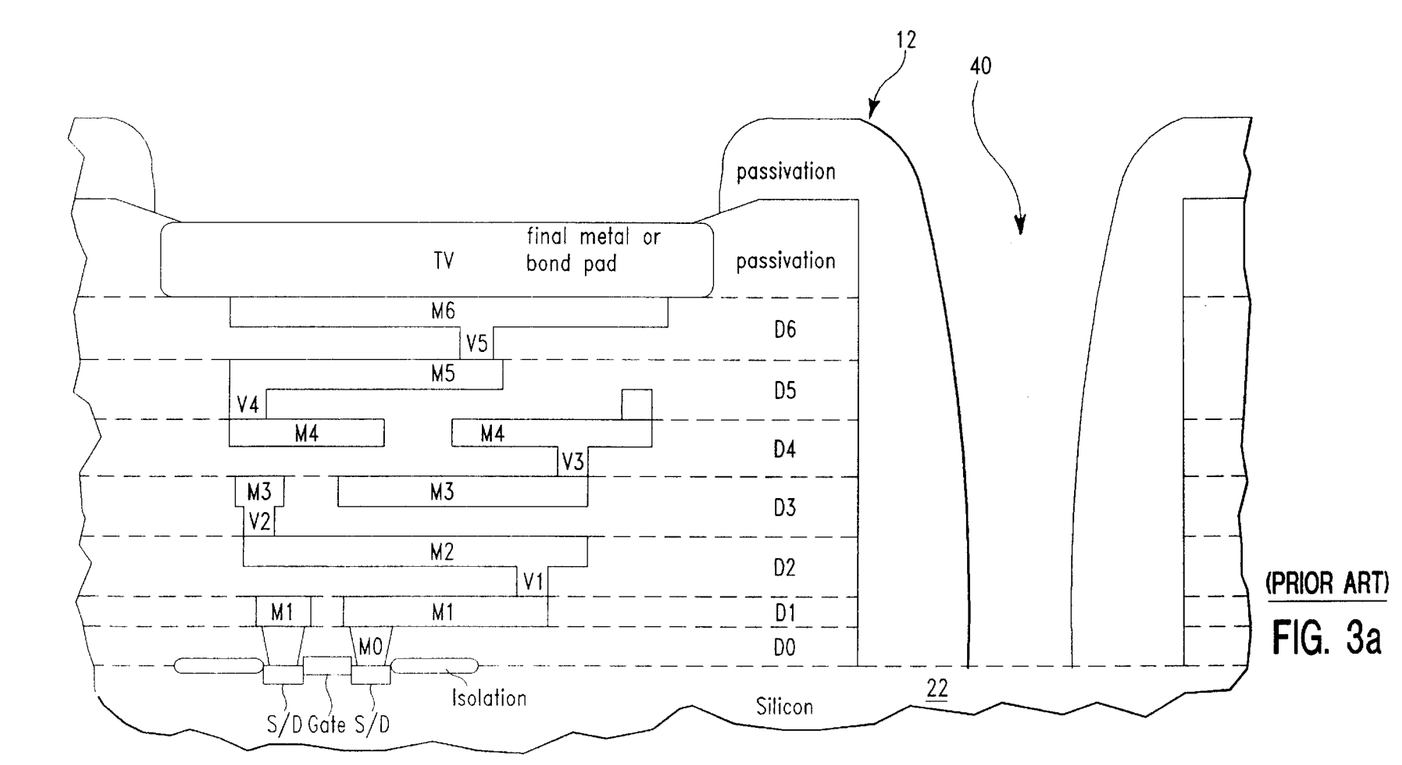
FIG. 3a is a cross sectional view of chip having a cleared dicing channel.
Figure 3B:
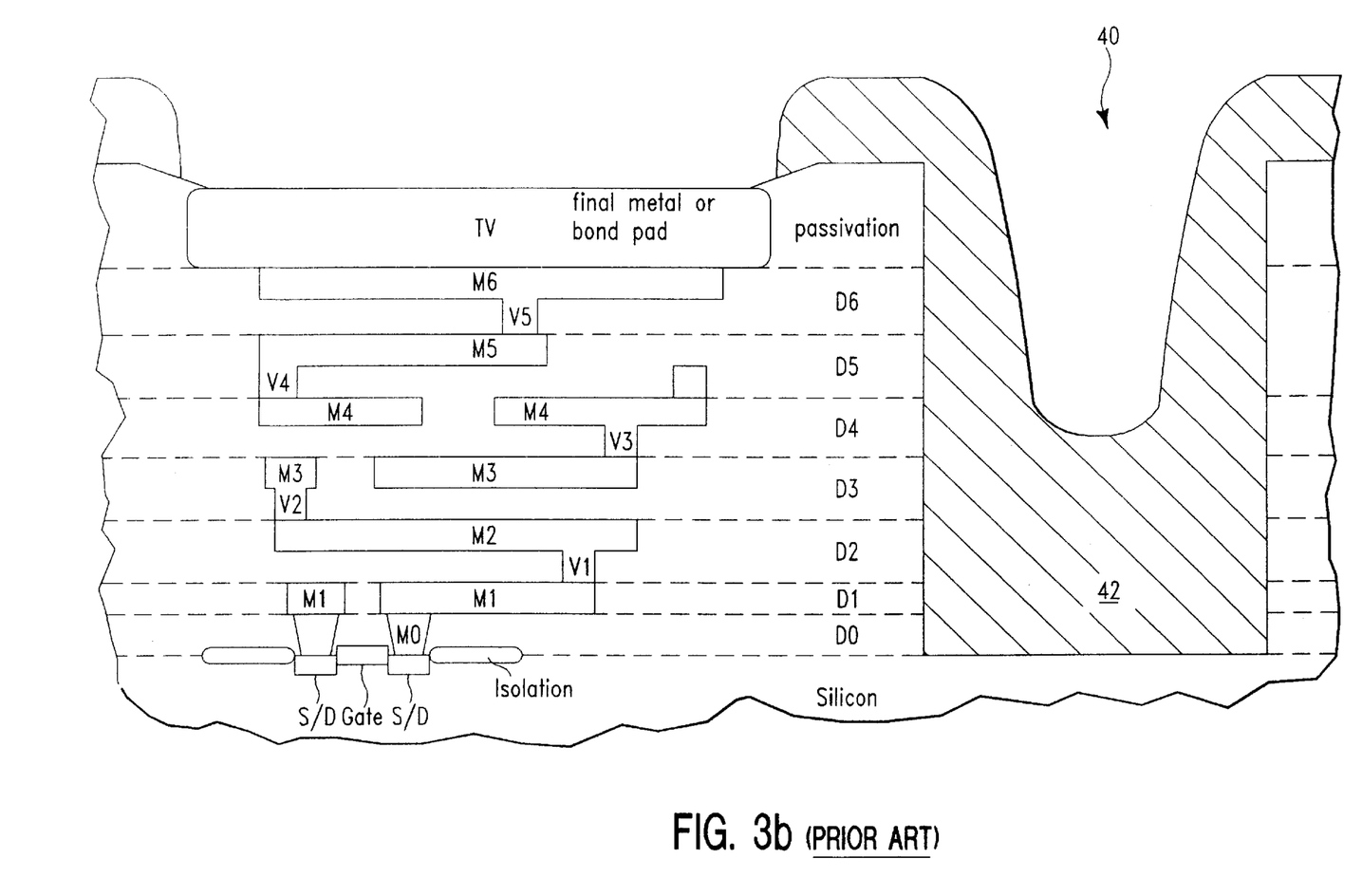
FIG. 3b is a cross sectional view of chip having shock absorbing material in the cleared dicing channel.
Figure 3C:
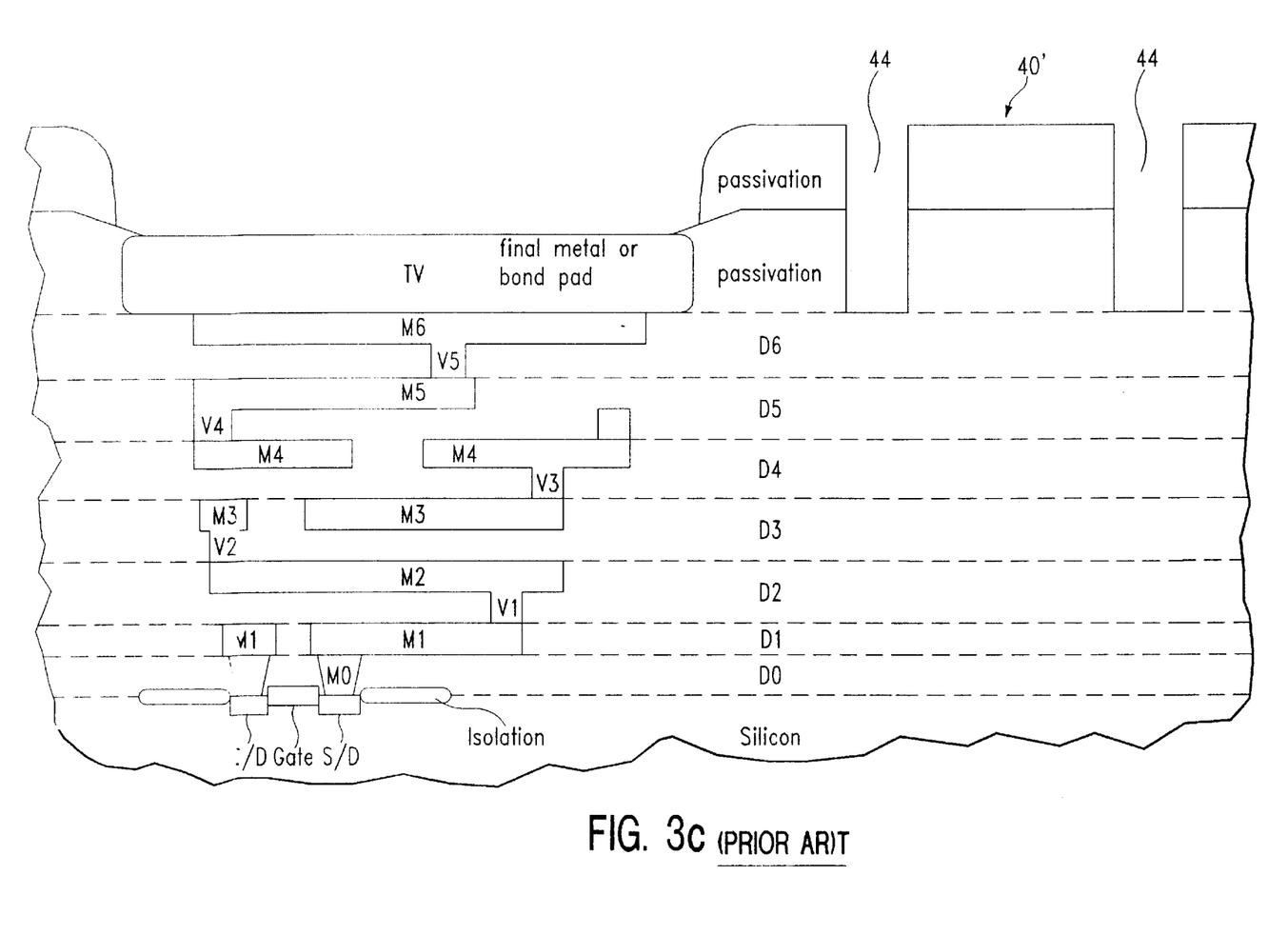
Figure 3D:
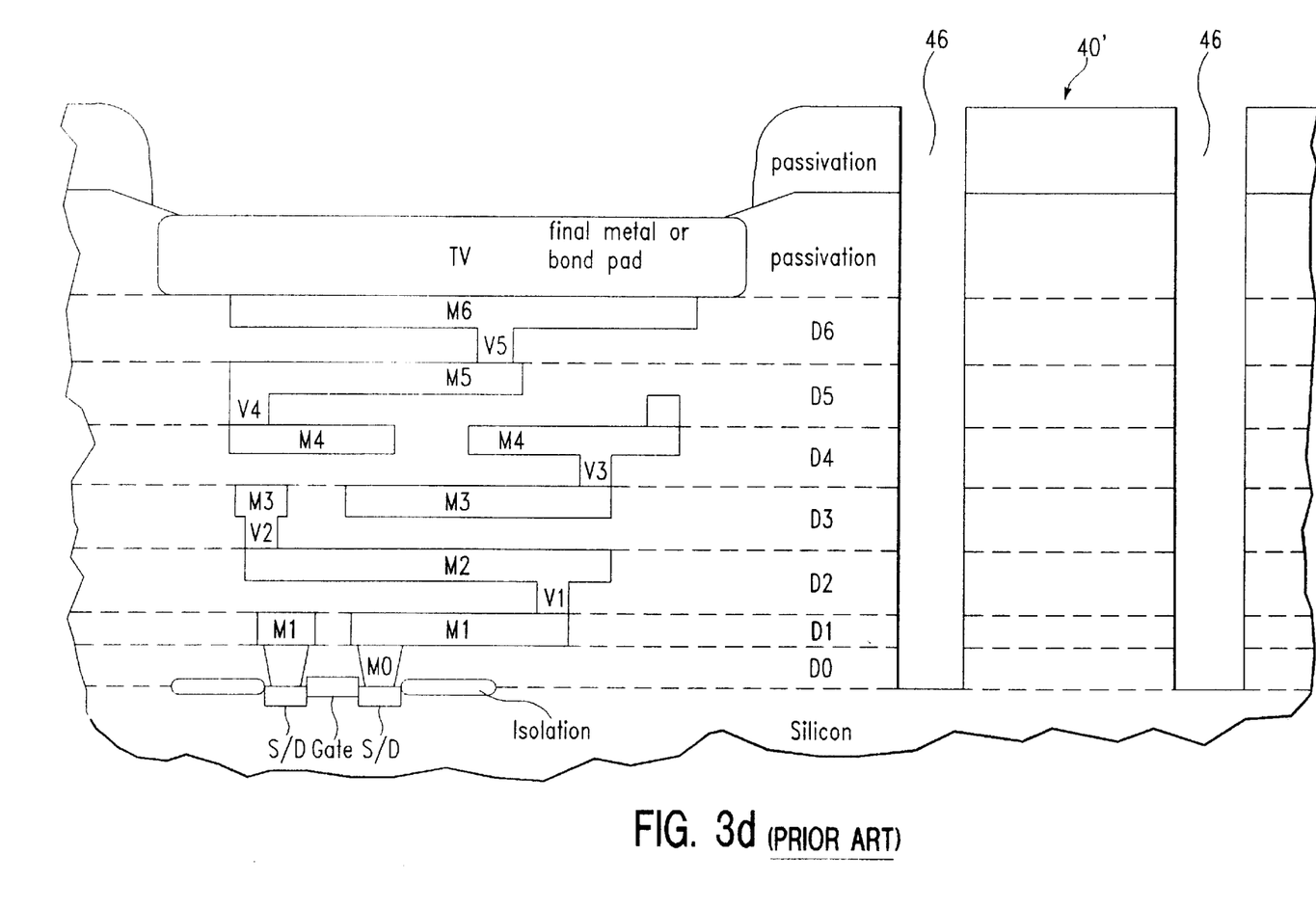

To improve chip yield and reliability, several methods have been proposed to either prevent initiation of delamination cracks or to reduce the probability of delamination crack propagation, as shown in FIGS. 3a–3d. For example, all of the layers may be removed from dicing channel 40 before dicing, as shown in FIG. 3a. Thus, dicing blade initiation of delamination cracks between any of the six thin film metallization layers shown and adjacent insulation layers is avoided. In addition, after removal of all thin film layers in dicing channel 40, ductile or shock absorbing material 42 can be used to prevent particles generated during dicing from contacting or interfering with nearby brittle thin film layers, as shown in FIG. 3b. Alternatively, small trenches 44 can be etched into one or more of the top layers on either side of dicing channel 40' to stop propagation of cracks in those layers, as shown in FIG. 3c. Of course, cracks initiated in lower lying layers D0–D6 will not be stopped by small trenches 44 of FIG. 3c. By contrast, deep trenches 46 of FIG. 3d can be used to prevent propagation of delamination cracks initiated in dicing channel 40' in any layer of the structure.

Unfortunately, introducing a gap such as gap 40, 44, or 46 adds additional process steps and substantial cost. This is particularly the case where active device areas must be masked during the etching steps required to form a gap or where different materials are +layered, and different etchants must be used sequentially for removal of the layers. Furthermore, any deposition steps for ductile material 42 adds yet additional costs, and adding ductile material in the dicing channel leads to excessive dicing blade sticking and poor dicing quality. Thus, a solution is needed that more effectively suppresses crack propagation without adding processing steps or cost, and this solution is provided by the following invention.

SUMMARY OF THE INVENTION

It is therefore an object of the present invention to provide a structure for inhibiting delamination crack propagation that requires no additional masks or processing steps in wafer fabrication.

It is a further object of the present invention to provide a filled crack stop that inhibits delamination crack propagation without requiring extra etching or deposition steps.

It is a feature of the present invention that a filled crack stop is provided that provides a large interfacial area.

It is a feature of the present invention that a filled crack stop has a serpentine pattern.

It is an advantage of the present invention that cracks are substantially inhibited without any additional cost or processing steps.

These and other objects, features, and advantages of the invention are accomplished by a semiconductor structure, comprising a semiconductor chip having an edge and an active area. A first substantially filled ring extends around the active area, the first ring having a first pattern feature for reducing propagation of delamination cracks from the edge to the active area.

In another aspect, the invention is a semiconductor structure, comprising a semiconductor chip having an edge and an active area. A serpentine ring extends around the active area.

In another aspect, the invention is a method of forming a crack stop structure in a semiconductor chip comprising the steps of: (a) providing a semiconductor chip having an edge and an active area; and (b) providing a first substantially filled ring extending around the active area, the ring comprising a plurality of metallization levels, the first ring having a first pattern feature for reducing propagation of delamination cracks from the edge to the active area.

BRIEF DESCRIPTION OF THE DRAWINGS

The foregoing and other objects, features, and advantages of the invention will be apparent from the following detailed description of the invention, as illustrated in the accompanying drawings, in which:

FIG. 3c is a cross sectional view of chip having a pair of air filled trenches extending through at least one thin film layer to prevent propagation of delamination cracks from a dicing step there between.

FIG. 3d is a cross sectional view of chip having a pair of air filled trenches extending through all thin film layers to prevent propagation of delamination cracks from a dicing step there between.

FIG. 4b is a cross sectional view showing the linear metal filled crack stop ring of FIG. 4a.

FIG. 5b is a section of the top view of FIG. 5a.

FIG. 5c is a cross sectional view of the serpentine ring of FIG. 5a.

FIG. 6b is a cross sectional view of the staggered crack stop ring of FIG. 6a.

FIG. 7b is a cross sectional view showing the double linear crack stop ring of FIG. 7a.

DETAILED DESCRIPTION OF THE INVENTION

The present invention provides a structure and process for providing a delamination crack stop around the active area of a chip. The crack stop provides protection from the propagation of cracks from the chip edge -while avoiding costly process steps.

Figure 4A:
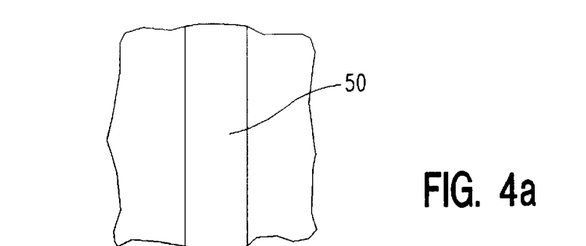
FIG. 4a is a top view showing a linear metal filled crack stop ring.
Figure 4B:
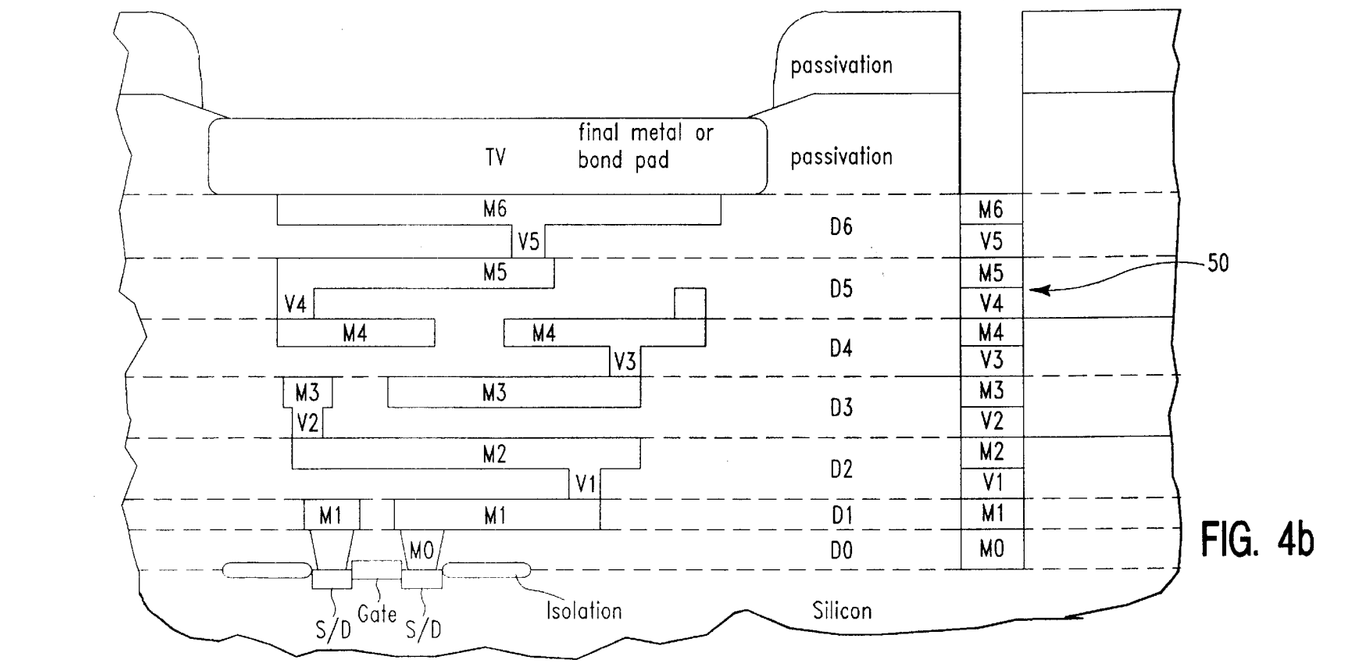

The present inventors confirmed that straight fine crack stop ring 50 filed with conductor as shown in FIGS. 4a and 4b was ineffective to stop delaminations from propagating into the active chip area. They also confirmed that when the conductor in the ring is etched out to provide a traditional air fill type crack stop, delamination cracks are very effectively stopped. However, recent advances in technology have made the production of air fill type crack stops increasingly costly. In previous technologies a single etch step removed all the metal in a crack stop ring. However, recent technologies have begun to use layered metals for each level, such as aluminum and titanium, and studs between levels of metal made out of yet another material, such as tungsten. Here multiple etch steps have become necessary, and a mask that protects active areas against all the sequential etch steps would be needed. The inventors found significant added cost to provide an air fill-type etch stop where these different metals were layered. Thus, the inventors addressed the problem of providing a more effective crack stop that did not require removal of the layers filling the etch stop ring.

Figure 5A:
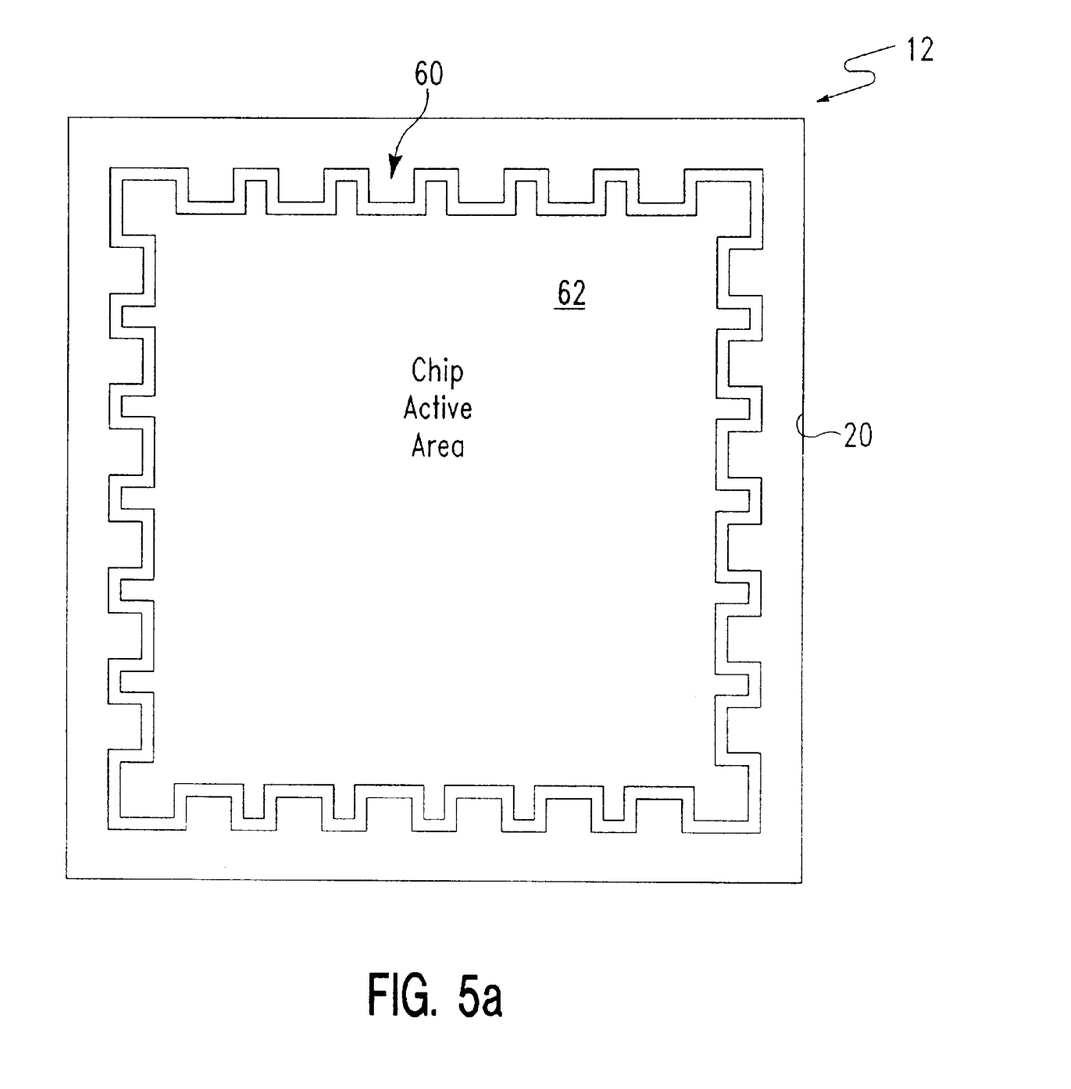
FIG. 5a is a top view of a chip of the present invention having a serpentine crack stop ring extending around the active area of the chip and adjacent the edges of the chip.
Figures 5B, 5C:
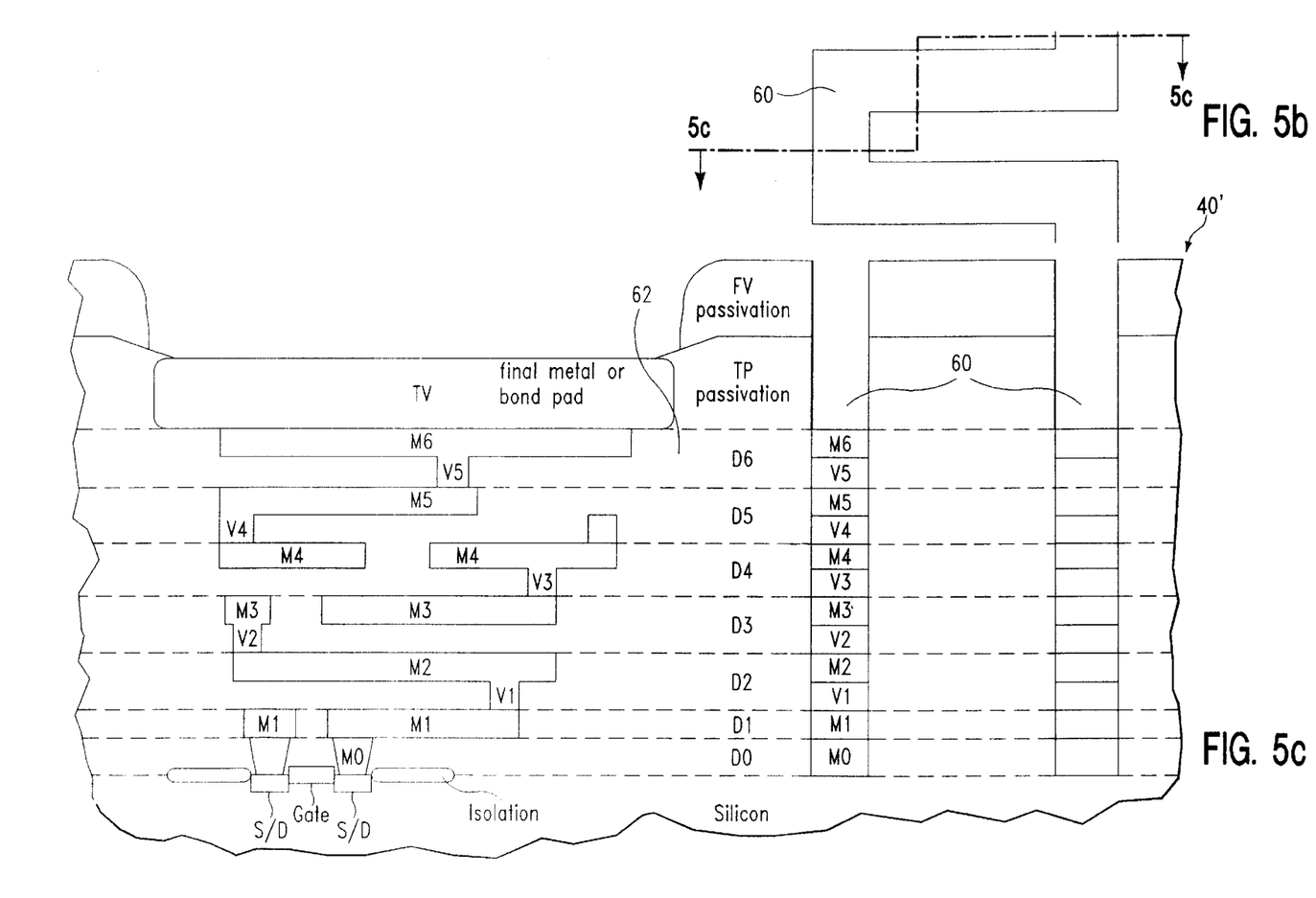

The present inventors found that larger crack stop wall area, multiple edges, multiple stacked layers of conductor, and other pattern features significantly improved protection from crack penetration. The present invention builds on that discovery, providing a pattern such as a serpentine ring of conductor 60 around active area 62 of chip 12, generally adjacent edge 20 of the chip as shown in FIG. 5a. Ring 60 is formed of stacked layers of conductor and insulator, including metallization levels M0–M6, final metal or bond pad TV, metallization interconnect studs V1–V5, and insulation layers D0–D6 and final passivation layers FV and TP as shown in FIG. 5b. These metallization, stud, and insulation layers are all provided for ring 60 in the same masking and deposition steps used to provide them in active area 62. However, the present inventors found that they could provide a crack stop that was nearly as efficient as a traditional air fill-type crack stop without adding any additional masking or etching steps simply by providing a crack stop ring in a geometric pattern, such as serpentine ring 60. The serpentine pattern sufficiently increases both the area of the crack stop and the stress relaxed volume surrounding the crack stop so that fracture resistance is substantially increased and fracture driving force is substantially decreased, as shown by the data in Table 1 below.

In experiments in which damage was deliberately introduced into diced chip edges, the data in Table 1 for device 3a shows that an aluminum filled serpentine patterned crack stop with a 40 μm spacing to chip edge stops crack penetration almost as well as air filled linear crack stops having 35 and 45 um wide spacings and substantially better than a tungsten filled linear crack stop. The data is also consistent with the expectation that a wider kerf offers greater protection than a narrower kerf. Table I presents the percent of cracks reaching the crack stop that were stopped by the crack stop. Thus, a serpentine pattern crack stop is almost as effective as an air fill-type crack stop without the cost of providing an air fill-type crack stop. Of course, if desired, other process steps, such as masking and etching can still be applied to remove one or more of the metal levels to further increase crack stop effectiveness. Thus, the ring of conductor 60 will become partially air filled. This configuration, where several of the metal levels of ring of conductor 60 have been removed to provide a partially air filled ring, is shown in FIG. 5d.

TABLE 1

| Device | Crack stop | Edge to crack stop spacing (μm) | Damage Stopped |
| --- | --- | --- | --- |
| 1 | linear air filled | 45 | 57% |
| 2A | linear air filled | 35 | 51% |
| 2B | linear W layers filled | 35 | 17% |
| 3A | Serpentine alternating Al and W layers filled | 40 | 45% |
| 3B | Serpentine alternating Al and W layers filled | 16 | 30% |

Figure 6A:
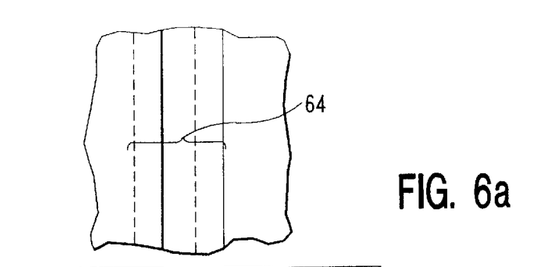
FIG. 6a is a top view showing a linear filled crack stop ring in which the layers of conductor are staggered by an amount greater than the overlay tolerance.
Figure 6B:
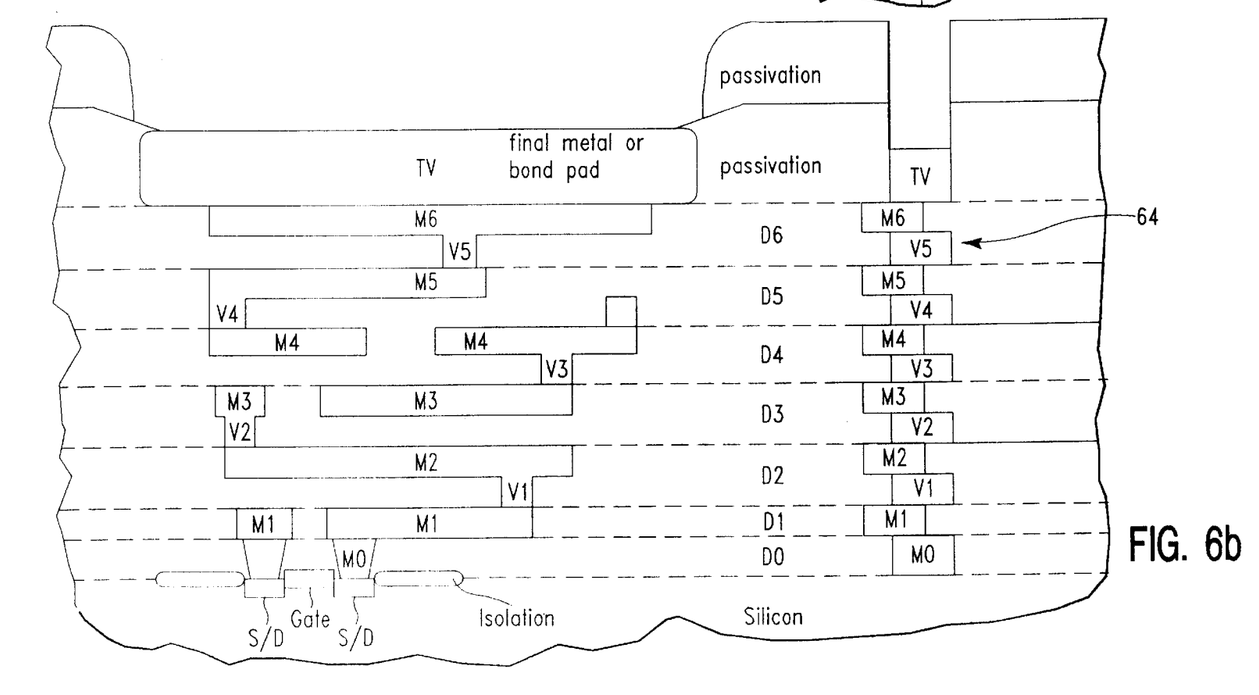
Figure 7A:
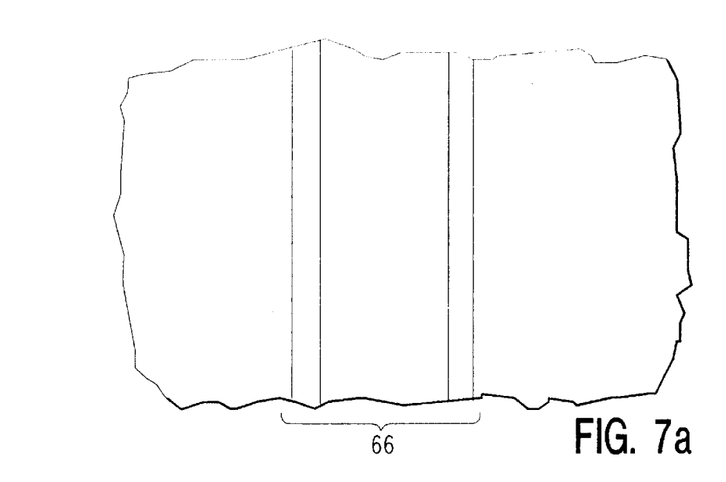
FIG. 7a is a top view showing a double linear filled crack stop ring.
Figure 7B:
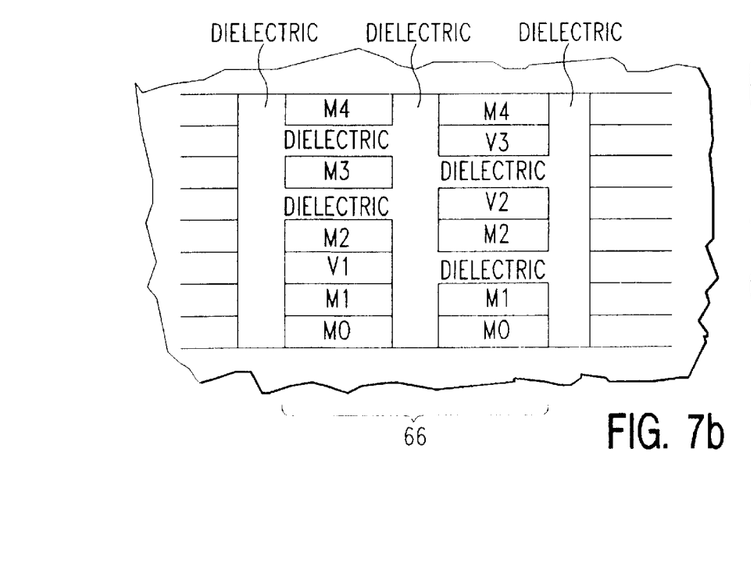
Figure 7C:
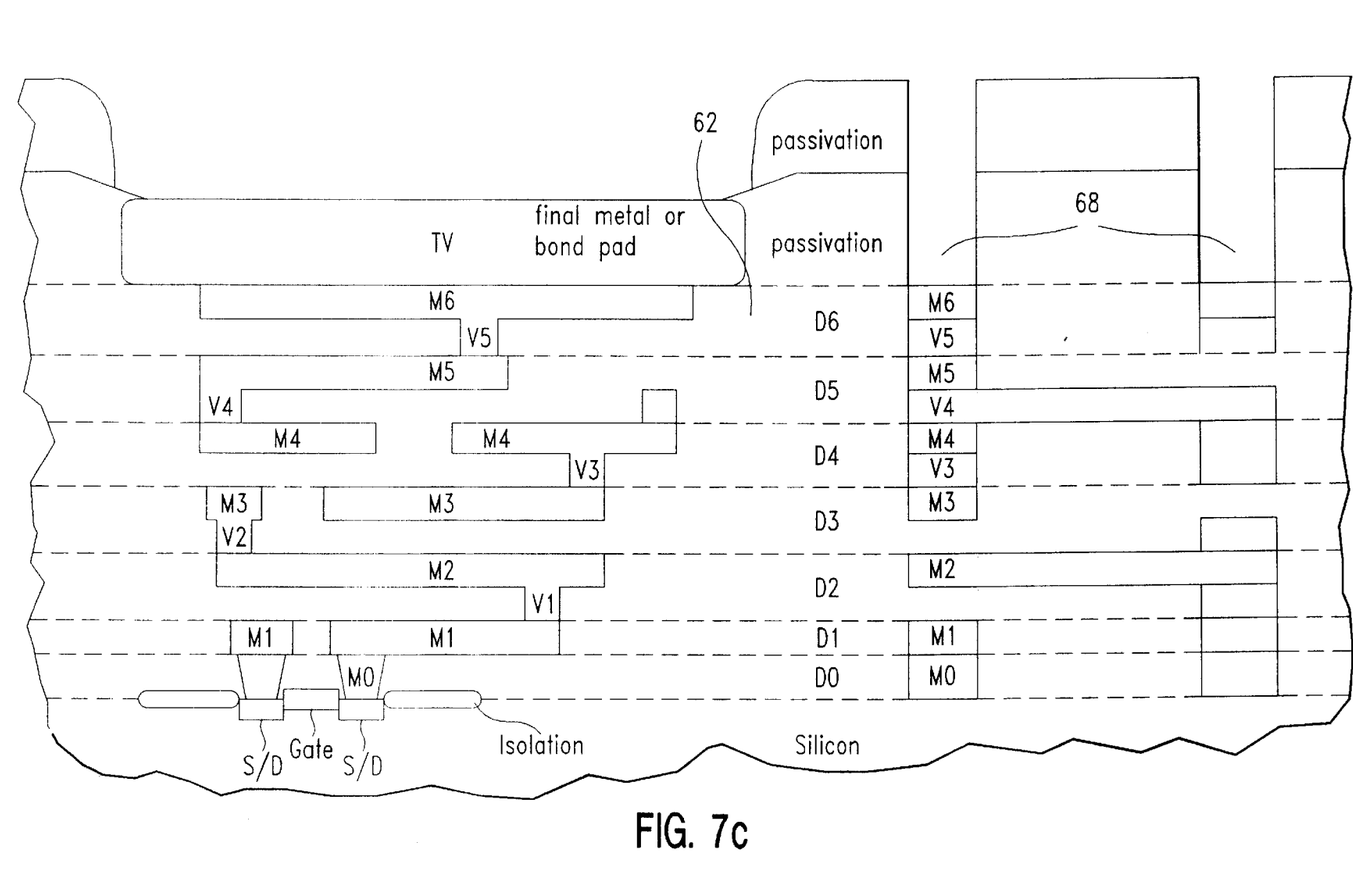
FIG. 7c is a cross sectional view showing the pair of linear filled crack stop rings of FIG. 7a in which the layers of conductor are interconnected from ring to ring.
Figure 8A:
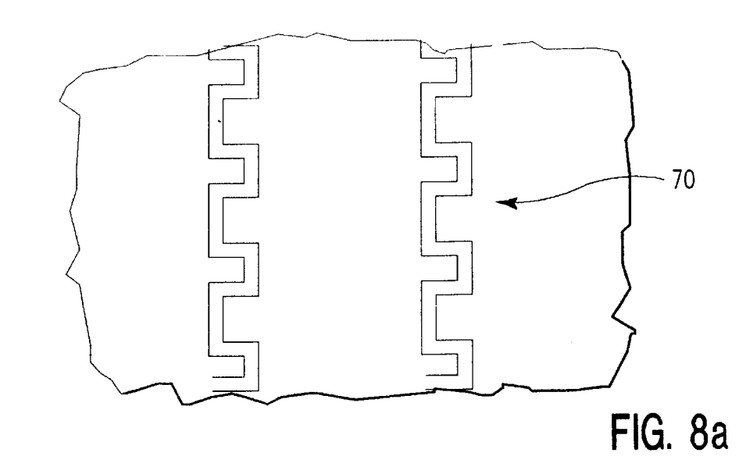
FIG. 8a is a top view showing a pair of serpentine filled crack stop rings.
Figure 8B:
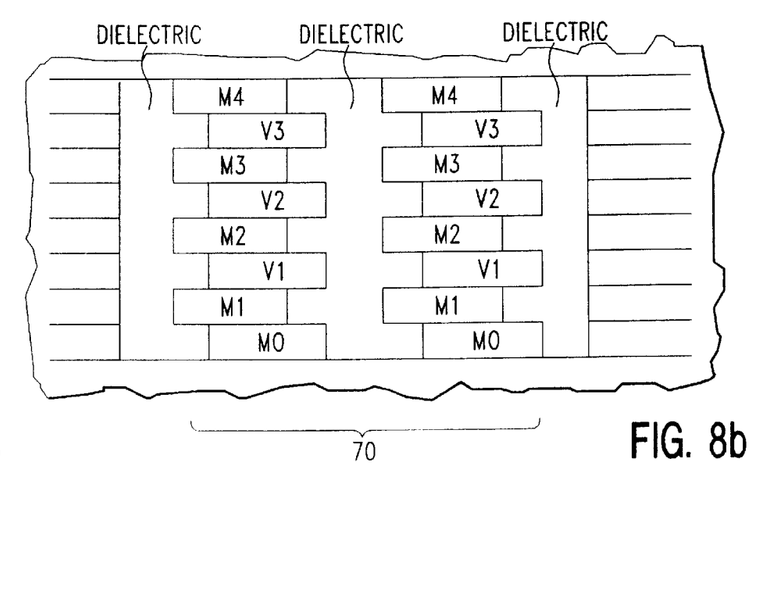
FIG. 8b is a cross sectional view of the pair of serpentine rings of FIG. 8a in which the individual layers are staggered.

In addition to serpentines, staggered filled ring pattern 64 (FIGS. 6a and 6b), double linear rings 66 (FIGS. 7a and 7b), and double interconnected rings 68 (FIG. 7c) also provide pattern alternatives that increase resistance to crack propagation as compared with single linear filled ring 50 (FIGS. 4*a* and 4*b*) while completely metal filled crack stop rings are preferred, layers of dielectric can be included if necessary as shown in FIGS. 7*b* and 7*c*. In addition combinations, such as multiple serpentines with staggered patterns 70 (FIGS. 8*a* and 8*b*), or interconnected multiple serpentines (not shown) can be used to further increase resistance to crack propagation. Staggering is achieved by a means such as expanding or shrinking ring 60 at successive masking levels by an amount approximately equal to the thickness of the layer. Thus, for layers about 1 um wide and 0.5 um thick, layer overlap of about 0.5 um is preferred. An interface between metal and insulator is weaker than continuous dielectric, and provides an opportunity for a crack to terminate or be deflected to the surface along the more compliant crack stop edge.

Because the region over which strain energy is reduced is proportional to the square of the width of the crack stop (up to a width about equal to the height of the crack stop), patterns involving wider crack stops offer greater protection than narrower crack stops. However, because a wider crack stop offers less area for the chip and kerf test structures, strict limits on width are usually imposed. The present inventors found that because a serpentine crack stop is more compliant than a pair of separated linear crack stops it works better at stopping cracks in less area.

The texture provided by structures such as serpentines, staggered layers, and double interconnected rings increases the probability that a delamination crack will find an interface extending in an appropriate direction and get stopped. In addition the structures provide a larger volume of material that is stress-relaxed, further reducing crack propagation.

While several embodiments of the invention, together with modifications thereof have been described in detail herein and illustrated in the accompanying drawings, it will be evident that various further modifications are possible without departing from the scope of the invention. For example, the crack stop can have multiple connected and staggered serpentines. Nothing in the above specification is intended to limit the invention more narrowly than the appended claims. The examples given are intended only to be illustrative rather than exclusive.

What is claimed is:

1. A method of forming a crack stop structure in a semiconductor chip comprising the steps of:

(a) providing a semiconductor chip having an edge and an active area; and (b) providing a first substantially filled ring extending around said active area, said ring comprising a plurality of conductor layers, said first ring having a first pattern feature for reducing propagation of delamination cracks from said edge to said active area, wherein said first ring pattern feature comprises staggered layers of conductor, said staggering extending beyond mask alignment tolerance for each layer of conductor.

2. A method as recited in claim 1, wherein said first ring is partially air filled.

3. A method as recited in claim 1, wherein said first ring is completely filled with said conductor layers.

4. A method as recited in claim 1, wherein said first ring pattern feature provides increased area for suppressing crack propagation as compared with a linear filled ring.

5. A method as recited in claim 1, wherein said first ring pattern feature further comprises a serpentine.

6. A method as recited in claim 1, further comprising a second substantially filled ring around said active area.

7. A method as recited in claim 6, wherein said second ring has a second pattern feature for reducing propagation of delamination cracks from said edge to said active area.

8. A method as recited in claim 7, wherein said second ring interconnects with said first ring.

9. A method of forming a crack stop structure in a semiconductor chip comprising the steps of:

(a) providing a semiconductor chip having an edge and an active area; and (b) providing a first ring extending around said active area, said ring comprising a plurality of conductive layers, wherein said first ring is partially air filled.

10. A method as recited in claim 9, wherein said first ring comprises a first pattern feature for reducing propagation of delamination cracks from said edge to said active area.

11. A method as recited in claim 10, wherein said first ring pattern feature provides increased area for suppressing crack propagation as compared with a linear filled ring.

12. A method as recited in claim 10, wherein said first ring pattern feature comprises a serpentine.

13. A method as recited in claim 9, further comprising a second ring around said active area, wherein said second ring comprises a plurality of conductive layers, wherein said second ring is partially air filled.

14. A method as recited in claim 13, wherein said second ring comprises a second pattern feature for reducing propagation of delamination cracks from said edge to said active area.

15. A method as recited in claim 12, wherein said second ring interconnects with said first ring.

* * * * *